(12) United States Patent
Ozdemir et al.

(10) Patent No.: US 8,990,670 B2
(45) Date of Patent: Mar. 24, 2015

(54) ENDURANCE AWARE ERROR-CORRECTING CODE (ECC) PROTECTION FOR NON-VOLATILE MEMORIES

(71) Applicants: Serkan Ozdemir, Barcelona (ES); Qiong Cai, Barcelona (ES)

(72) Inventors: Serkan Ozdemir, Barcelona (ES); Qiong Cai, Barcelona (ES)

(73) Assignee: Intel Corporation, Santa Clara, CA (US)

( * ) Notice: Subject to any disclaimer, the term of this patent is extended or adjusted under 35 U.S.C. 154(b) by 203 days.

(21) Appl. No.: 13/630,541

(22) Filed: Sep. 28, 2012

(65) Prior Publication Data
US 2014/0095956 A1 Apr. 3, 2014

(51) Int. Cl.
*H03M 13/00* (2006.01)
*G06F 11/00* (2006.01)
*G11C 29/42* (2006.01)
*H03M 13/11* (2006.01)

(52) U.S. Cl.
CPC ............... *G11C 29/42* (2013.01); *H03M 13/11* (2013.01)
USPC ....................................................... 714/810

(58) Field of Classification Search
CPC ..... G06F 11/044; G06F 11/072; G11C 29/42; H03M 13/11
USPC ................. 714/6.11, 746, 763, 764, 755, 810
See application file for complete search history.

(56) References Cited

U.S. PATENT DOCUMENTS

| 6,601,211 | B1 | 7/2003 | Norman |
| 8,621,328 | B2* | 12/2013 | Franceschini et al. ........ 714/773 |
| 2010/0017649 | A1* | 1/2010 | Wu et al. ........................... 714/6 |
| 2010/0023800 | A1 | 1/2010 | Harari et al. |
| 2010/0153821 | A1 | 6/2010 | Keeler |

FOREIGN PATENT DOCUMENTS

| WF | WO-2008042593 | 4/2008 |
| WO | WO-2007054873 | 5/2007 |

OTHER PUBLICATIONS

Roman et al., sub-block wear leveling for NAND flash, IBM, Jun. 2011, pp. 1-13 (retrieved from Google Jun. 16, 2014).*
Pan et al., Exploiting memory devices wear-out dynamics to improve NAND flash memory system performance, Feb. 2011, ACM, pp. 1-14.*

(Continued)

*Primary Examiner* — Shelly A Chase
(74) *Attorney, Agent, or Firm* — Blakely, Sokoloff, Taylor & Zafman LLP

(57) ABSTRACT

Embodiments of the invention relate to endurance-aware ECC protection for memories (e.g., phase change memories). According to one embodiment, a method includes calculating first metadata for data bits and second metadata for ECC bits which protect the data bits and the first metadata. Embodiments can include one or more first metadata bits (for the data bits), and one or more second metadata bits (for the ECC bits). An additional level of ECC protection protects the second metadata. In one embodiment, the wear-reduction modifications applied to the data bits and the ECC bits are different, and can be tailored to the behavior of the bits. According to one embodiment, the endurance-aware ECC protection described herein reduces wear due to accesses to memories while addressing the complications wear-reduction mechanisms introduce to error detection and correction systems.

24 Claims, 8 Drawing Sheets

(56) References Cited

OTHER PUBLICATIONS

*International Search Report and Written Opinion from* PCT/US2013/045432 mailed Mar. 13, 2014, 10 pages.

Cho, Sangyeun, et al. "Flip-N-Write: A Simple Deterministic Techique to Improve PRAM Write Performance, Energy and Endurance", *Computer Science Department*, University of Pittsburgh, 11 pages, Dec. 16, 2009.

Qureshi, Moinuddin K. et al. "Enhancing Lifetime and Security of PCM-Based Main Memory with Start-Gap Wear Leveling", *IBM Research, T. J. Watson Research Center*, Yorktown Heights NY 10598, 10 pages, Dec. 16, 2009.

Schechter, Stuart, et al. "Use ECP, not ECC, for Hard Failures in Resistive Memories", *Microsoft Research*, Redmond, WA, *Georgia Institute of Technology*, Atlanta, GA, 12 pages, Jun. 2010.

\* cited by examiner

ENDURANCE AWARE ERROR-CORRECTING CODE (ECC) PROTECTION FOR NON-VOLATILE MEMORIES

BACKGROUND

Memories can experience errors during operation due to a number of reasons. Error-correcting codes (ECC) schemes exist to handle errors occurring in memory and increase short-term reliability (e.g. single error correction and double error detection (SECDED) schemes).

Some non-volatile memories have limited write cycles. Some non-volatile memory with limited write cycles are capable of performing writes in such a way that only the bits that change their value during a write operation are written back, and the bits that do not change their value for a particular write remain untouched (and thus, the write operation does not cause further wear to those bits). Some systems implement wear-reduction schemes, which can extend the life of a non-volatile memory (i.e., delay wear-out of the non-volatile memory).

Existing non-volatile memories either implement wear reduction while failing to consider the impact on short-term reliability (e.g., ECC mechanisms), or propose mechanisms for error detection/correction while failing to consider the impact on the lifetime of the non-volatile memory.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive. In the following description and claims, the term "coupled" and its derivatives may be used. The term "coupled" herein may refer to two or more elements which are in direct contact (physically, electrically, magnetically, optically, etc.), or to two or more elements that are not in direct contact with each other, but which still interact with each other.

DETAILED DESCRIPTION

Figure 1:
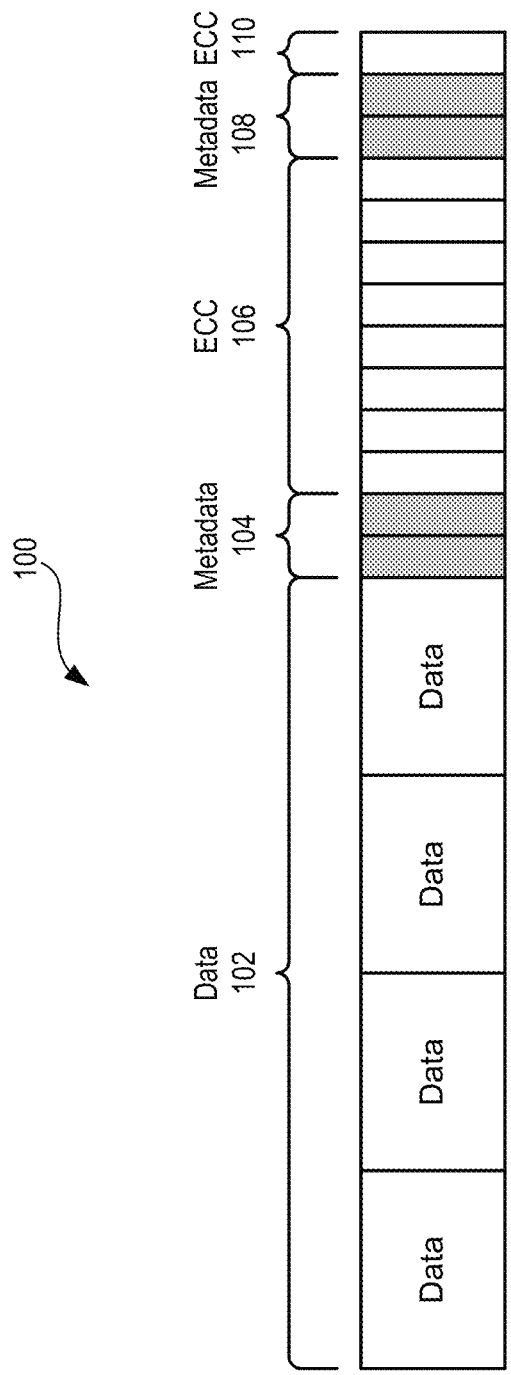
FIG. 1 is a block diagram of content to be stored to a non-volatile memory, including metadata and ECC bits to reduce wear of the non-volatile memory while providing error protection, according to one embodiment.

Embodiments of the invention relate to an apparatus, system, and method for endurance-aware error correction. Endurance-aware error correction reduces wear in non-volatile memory technologies while providing ECC protection to achieve improved long term reliability while maintaining short term reliability. "ECC protection" as used herein refers to error correction and/or detection. "Wear reduction" refers to reducing wear of a non-volatile memory (e.g., reducing the number of bits written to the non-volatile memory) and/or leveling wear (e.g., making the number of times memory cells of the non-volatile memory have been written to more level). Wear reduction can be achieved by modifying bits to be written to a non-volatile memory according to a wear-reduction algorithm, and providing some mechanism for recovering the original bits from the modified bits. One mechanism for recovering the original bits from modified bits is to calculate metadata identifying the modification made to the original bits, and to store the metadata (e.g., with the modified data in the non-volatile memory, or in a separate location and/or a separate device). Two examples of wear-reduction schemes are discussed below with respect to FIGS. 3 and 4.

Endurance aware ECC protection can be used in non-volatile memory technologies to reduce wear of the non-volatile memory while providing ECC protection.

One embodiment implements wear reduction for both data bits and ECC bit(s), and includes a second level of ECC protection. The second level of ECC protection can extend the ECC mechanism to cover all generated metadata bits in addition to the data bits. Some examples of possible wear-reduction and ECC schemes are described below in further detail, but the particular wear-reduction and ECC schemes implemented can include any schemes capable of wear reduction and ECC protection to achieve desired protection against errors and extend the life of a non-volatile memory.

In one embodiment, a wear-reduction technique involves rotation of bits (e.g., data bits) within a single data word (e.g., a within a 32-bit word, a 64-bit word, or other within a word of other sizes). One such embodiment can be based on one or more write counters, as is described below.

According to one embodiment, different types of content utilize different wear-reduction techniques. For example, data bits utilize one wear-reduction technique, and ECC bits utilize a different wear-reduction technique. The wear-reduction technique for data bits can be tailored to the behavior of the data bits, and the wear-reduction technique for ECC bits can be tailored to the behavior of the ECC bits. For example, a small subset of the data bits may change values during consecutive accesses, but ECC bits may change with most consecutive accesses. In one such example, a rotation mechanism can be utilized to perform rotation of data bits, while a "flip" mechanism can be utilized to perform inversions on ECC bits. A rotation mechanism is described below in greater detail with respect to FIG. 3, and a flip mechanism is described below in greater detail with respect to FIG. 4. In one embodiment, implementing different wear-reduction mechanisms for data bits and ECC bits results in substantial improvements in the lifetime of the non-volatile memory.

In the following description, numerous details are discussed to provide a more thorough explanation of embodiments of the present invention. It will be apparent, however, to one skilled in the art, that embodiments of the present invention may be practiced without these specific details. In other instances, well-known structures and devices are shown in block diagram form, rather than in detail, in order to avoid obscuring embodiments.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

FIG. 1 is a block diagram of content to be stored to a non-volatile memory, including metadata and ECC bits to reduce wear of the non-volatile memory while providing error protection, according to one embodiment.

Embodiments of the invention include wear-reduction techniques that utilize metadata bits and an extension of the ECC scheme to provide the desired ECC protection level. As illustrated in FIG. 1, content 100 to be stored in memory includes data bits 102, metadata bits 104, ECC bits 106, second metadata bits 108, and second ECC bits 110. The data bits 102 are data received in a write request, and modified according to a wear-reduction algorithm after they are received. The metadata bits 104 indicate any wear-reduction modifications made to the data bits 102, and enable recovery of the original data bits when a read request is received for the memory location where the data is stored in the non-volatile memory. The modification made to the data bits 102 can include modifications made according to any wear-reduction technique (e.g., rotation, inversion, a combination of rotation and inversion, or any other wear-reduction technique); different wear-reduction techniques may require different numbers of the metadata bits 104. Although two metadata bits 104 are illustrated, one metadata bit or a plurality of metadata bits may be used. Additional metadata bits may provide improved wear reduction, but can increase storage overhead.

The ECC bits 106 provide error protection for the data bits 102 and the metadata bits 104. Any ECC scheme can be used (e.g., an ECC scheme implementing SECDED, 4EC5ED, or other levels of ECC protection). Although eight ECC bits 106 are illustrated, any number of ECC bits can be utilized to implement the desired ECC scheme (e.g., one ECC bit, or a plurality of ECC bits). The ECC bits 106 are modified according to a wear-reduction algorithm. The wear-reduction technique applied to the ECC bits 106 may be the same as, or different than, the wear-reduction technique applied to the data bits 102. Applying different wear-reduction techniques can enable improved wear reduction by tailoring each technique to the write patterns of the different types of content to be stored in the bits.

The metadata bits 108 indicate the modification made to the ECC bits 106. Although two metadata bits 108 are illustrated, one or more metadata bits 108 may be used.

Because the metadata bits 108 indicate modifications for the ECC bits 106, the ECC bits 106 do not provide ECC protection for the metadata bits 108. This is because if the metadata bits 108 are calculated from the ECC bits 106, it could trigger certain modifications in the ECC bits to achieve wear-leveling. Thus, using the ECC bits 106 for the metadata bits 108 could violate the protection level A second level of ECC protection is provided with the ECC bit 110 for protecting the metadata bits 108. Although a single ECC bit is illustrated, one ECC bit or a plurality of ECC bits may be used. For example, a single parity bit as illustrated can be used, or for systems utilizing more than two metadata bits and/or systems implementing other levels of ECC protection, more complex protection mechanisms using additional ECC bits can be adopted.

In the illustrated embodiment where there are 64 data bits, the content 100 enables SECDED (72, 64) protection, while simultaneously enabling wear reduction. The introduction of the two metadata bits 104 can be accommodated in the ECC scheme with minor changes to the encoding and decoding logic, and with no additional protection bits. Depending on the number of metadata bits 104 and the level of ECC protection, implementations can include fewer or additional ECC bits.

SECDED protection with wear reduction can be achieved using a rotation scheme with two "rotation bits" 104 indicating a rotation performed on the data bits 102, and a flip scheme with two "flip bits" 108 indicating inversion of the ECC bits 106. Other embodiments can implement other variations of wear-reduction schemes. For example, embodiments can implement the flip scheme for the data bits 102 and the rotation scheme for the ECC bits 106, the same scheme for both the data bits 102 and the ECC bits 106, or any other wear-reduction schemes. The rotation and flip schemes for wear reduction are described below in greater detail.

The metadata bits 104 and 108 and the ECC bits 106 and 110 can be stored in the non-volatile memory along with the data bits 102, or can be stored separately in a different location and/or device. In one embodiment where the metadata bits and/or ECC bits are stored separately from the data, the bits which are stored separately can be accessed in parallel with the data or sequentially. In one such embodiment, if the ECC bits are stored in a memory without endurance limitations (e.g., in a memory without a limited number of write cycles), the implementation does not include metadata bits for the ECC bits. An implementation that stores the metadata bits and ECC bits with the data bits can be simpler and/or more cost effective due to reduced hardware requirements and increased ease of scheduling accesses.

Storing metadata bits separately can enable mapping a single set of metadata bits to multiple words in memory. For example, metadata bits 104 can be stored separate from data bits 102, and indicate a modification made to data bits 102 in addition to indicating the modification to other data bits stored in the non-volatile memory. Mapping a single set of metadata bits to multiple words in memory can impact the encoding process. In one embodiment where the metadata bits are stored with the data bits, an additional read to determine the value of the metadata bits is not necessary. In one embodiment where the metadata bits are stored separately from the data bits, encoding involves reading the metadata bits, and performing the modification indicated by the metadata bits. In one such embodiment, when the metadata bits are to be changed, the process involves reading the words from memory that rely on the same metadata bits, performing the modification indicated by the new value of the metadata bits, and storing the modified words back to memory. Performing the modification indicated by the new value of the metadata bits can also involve determining the original value of the word to be modified (e.g., decoding the modified word prior to re-encoding the word according to the new metadata bits). In one embodiment, determining whether or not to update the metadata bits can be based on the data bits, the initial value of the metadata bits, or a combination of the two.

Figure 2:
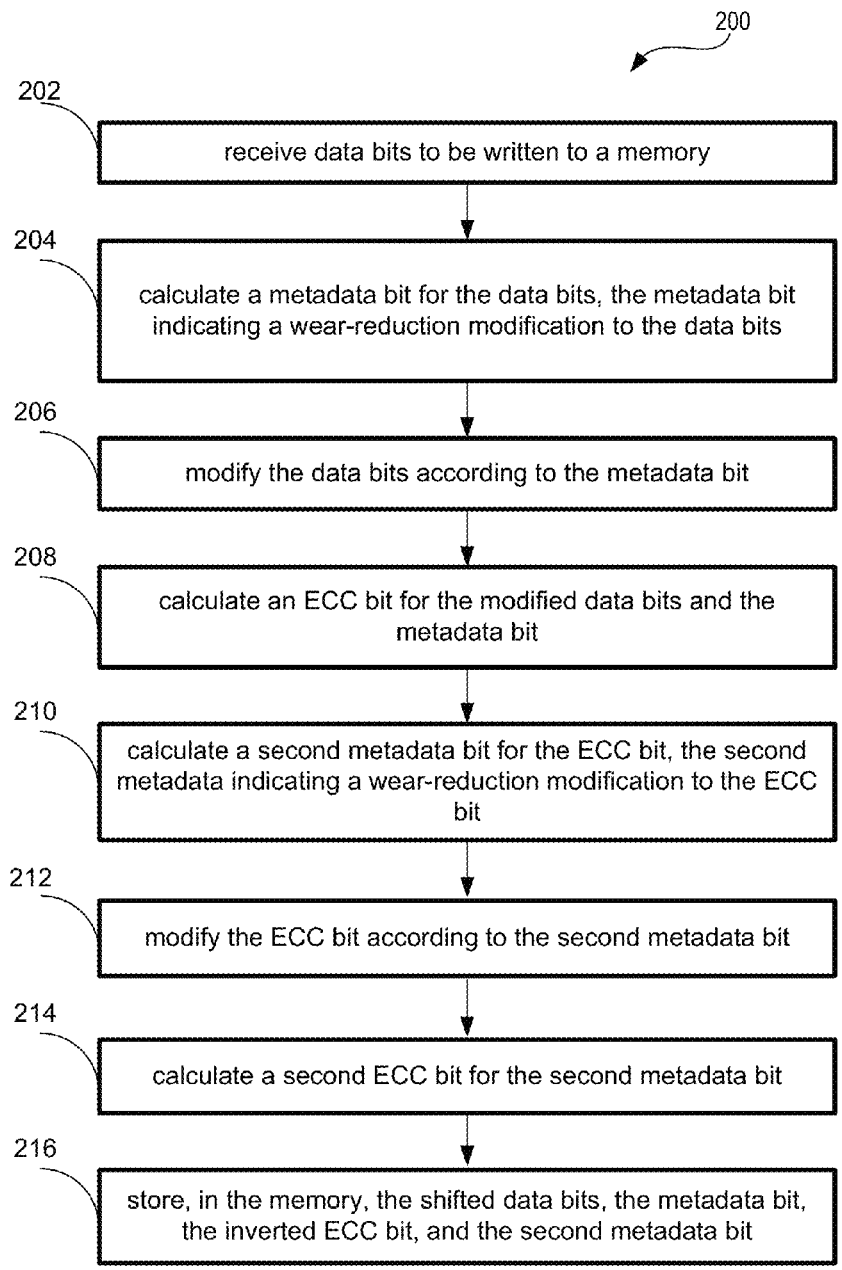
FIG. 2 is a flow diagram of a process for encoding data, including calculating a metadata bit, an ECC bit, a second metadata bit, and a second ECC bit, according to one embodiment.

FIG. 2 is a flow diagram of a process for encoding data, including calculating a metadata bit, an ECC bit, a second metadata, and a second ECC bit, according to one embodiment.

Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

The processes described herein can be implemented in hardware, software, or a combination of hardware and software. The processes are described below as performed by a system, which is intended to describe one or more of the embodiments described herein, and/or other variations that would be understood by a person skilled in the art. For example, in one embodiment, logic within a memory controller performs the processes. In another embodiment, logic within a non-volatile memory performs the processes. In yet another embodiment, logic within both the memory controller and the non-volatile memory, and/or logic located in another logic block perform the processes.

The process 200 begins by receiving data to be written to a non-volatile memory, 202. For example, a system receives a request to write the data to the non-volatile memory. After receiving the data bits to be written, the system calculates a metadata bit for the data bits (e.g., metadata bits 104 of FIG. 1); the metadata bit indicates a wear-reduction modification (e.g., wear-reducing modification) to the data bits, 204. The wear-reduction modification can include any modification to reduce or level wear of the non-volatile memory. For example, the wear-reduction modification to the data bits can include a shift of the data bits. A shift of the data bits can involve a cyclic shift of groups of data bits, or other non-random or random shifts of data bits. The shift of the data bits can be based on a write counter. For example, the write counter can indicate a number of writes to a word, a page to which the data bits are to be written, the non-volatile memory, or other granularities of memory units.

After determining how to modify the data bits (as indicated by the metadata bit for the data bits), the system modifies the data bits accordingly, 206. For example, if the data bits are to be cyclically rotated, the system determines by how many bits to rotate the data bits, and rotates those bits. In another example, if the data bits are to be inverted based on an existing value at the memory location, the system determines which bits to invert, and inverts those bits. The modified data bits (e.g., data bits 102 of FIG. 1) are to be stored in the non-volatile memory.

The system calculates an ECC bit (e.g., ECC bits 106 of FIG. 1) for the combination of the modified data bits and the metadata bit, 208. For example, where the system shifted the data bits, the system calculates an ECC bit for shifted data bits and the metadata bit indicating the shift to data bits.

After calculating the ECC bit, the system calculates a second metadata bit (e.g., metadata bits 108 of FIG. 1); the second metadata bit indicates a wear-reduction modification to the ECC bits, 210. The system modifies the ECC bit (as indicated by the second metadata bit), 212. For example, if the ECC bit is to be inverted based on the existing value at a location where the ECC bit is to be written, the system inverts the ECC bit. In another example where the ECC bit is to be rotated, the system rotates the ECC bit.

After calculating the second metadata bit, the system calculates a second ECC bit (e.g., ECC bit 110 of FIG. 1) for the second metadata bit, 214.

Finally, the system stores, in the non-volatile memory, the modified data bits, the metadata bit, the modified ECC bit, the second metadata bit, and the second ECC bit, 216. For example, the system stores the shifted data bits, the metadata bit, the inverted ECC bit, the second metadata bit, and the second ECC bit.

Although the process 200 refers to a single metadata bit, ECC bit, second metadata bit, and second ECC bit, one or more of each of those bits may be used. Additionally, although the process refers to rotating and/or inverting bits, a wear-reduction technique may or may not result in a modification to a bit for given inputs. For example, if an inversion technique is used, and both the value to be written and the existing value at that location are the same, the bit may not be inverted.

Figure 3:
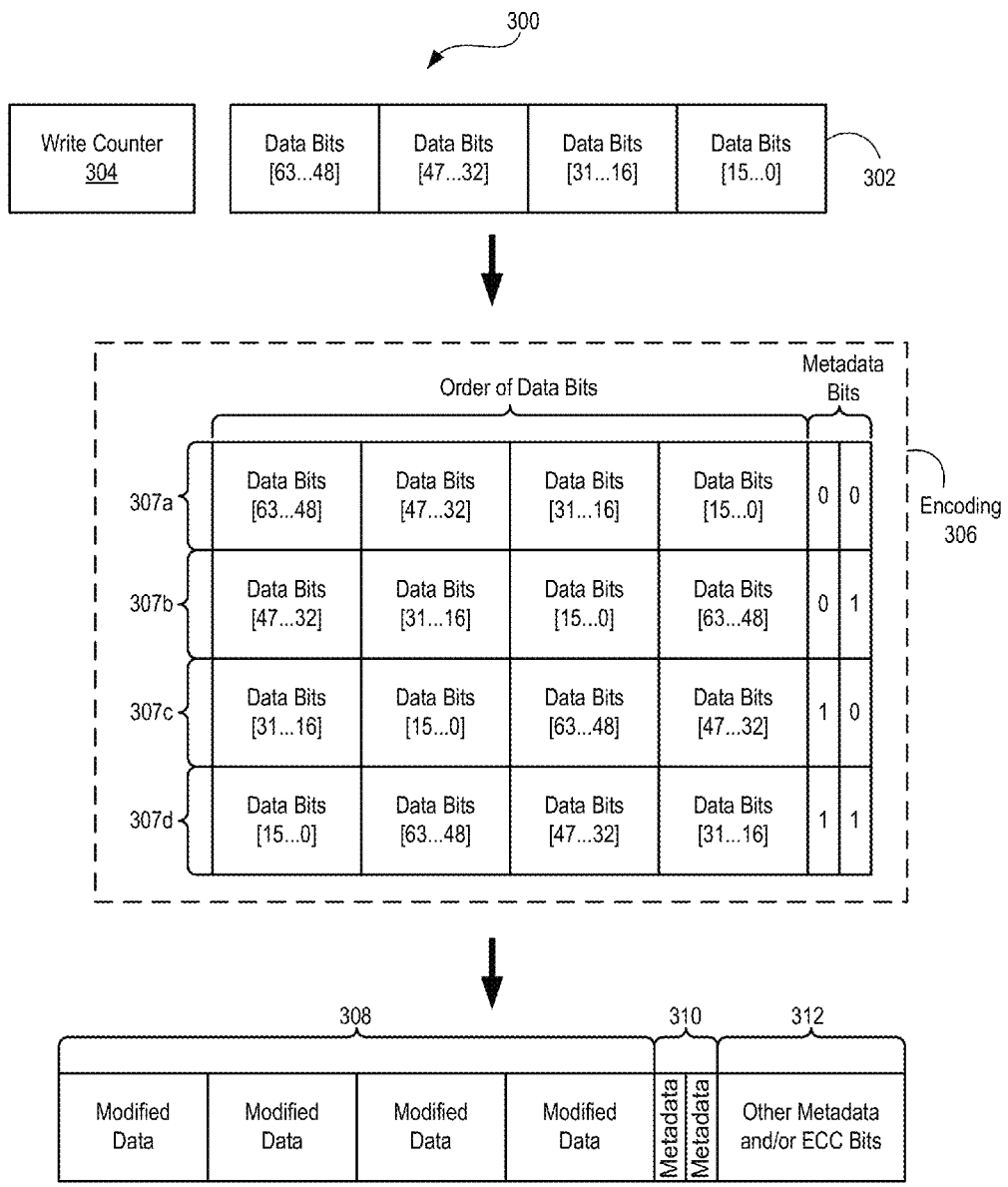
FIG. 3 is a block diagram of a metadata encoding scheme for data bits, according to one embodiment.

FIG. 3 is a block diagram of a metadata encoding scheme for data bits, according to one embodiment.

The encoding scheme 300 starts with data bits 302 to be stored to a non-volatile memory. In this example, a 64-bit word is illustrated; however, encoding schemes can apply to any number of data bits (e.g., 8 bits, 32 bits, a page, or any other granularity of memory units). In one embodiment, a write counter 304 indicates a number of writes to a word, a page, the non-volatile memory, or any other granularity of memory units. The granularity for the write counter can be the same or different than the granularity of the encoding scheme. For example, the encoding scheme can apply to a 64-bit word, and be based on a write counter indicating the number of writes to the entire memory. In one embodiment using a write counter, the system increments the write counter 304 for each relevant write request. The write counter 304 can also roll over and/or be reset when a predetermined number is reached or due to some other condition.

The encoding table 306 illustrates an example of a rotation scheme for 64 data bits using two metadata bits. A rotation scheme such as the one illustrated in the encoding table 306 can provide improved wear reduction for data bits due to, for example, the behavior of data bits (e.g., in some typical applications, a small subset of the data bits change values during consecutive accesses).

In the encoding scheme illustrated in table 306, the data bits are cyclically rotated by (16*the value of the metadata bits). In the illustrated embodiment, each value of the metadata bits represents a particular pre-determined and/or hard-wired cyclic-shift amount for the data bits 302. During a write, the data bits are cyclically-shifted by one of these pre-determined values, and the cyclic-shift amount used is also stored in the non-volatile memory. The metadata bits are updated after every N writes to the non-volatile memory, according to one embodiment. In the illustrated example, encoding 307a is used if (the value of the write counter/N modulo 4) is 0, encoding 307b is used if the value of the write counter/N modulo 4 equals 1, encoding 307c is used if the value of the write counter/N modulo 4 equals 2, and encoding 307d is used if the value of the write counter/N modulo 4 equals 3.

Other embodiments may include other rotate amounts and/or patterns. For example, a system can use a random function to choose whether to switch to a new shift amount and/or pattern, and/or select the new shift amount value. In one such example, a system can cyclically rotate the data bits based on a random seed, and store the random seed for recovery of the original data bits. The selection of the new shift amount can be based on the shift amount of the data it is replacing (e.g., following a pre-determined pattern of shift amounts) or can be completely randomized. The resulting metadata bits 310 can be stored with the modified data 308, including other metadata and/or ECC bits 312, as described above with reference to FIGS. 1 and 2.

During a read, and after ECC checks are complete, the metadata bits stored with the data are determined, and the data bits are shifted in the opposite way according to the metadata bits to regenerate the original data bits.

Although the metadata encoding scheme 300 refers to encoding for data bits, ECC bits or bits of other types can also use a rotation encoding scheme.

Figure 4:
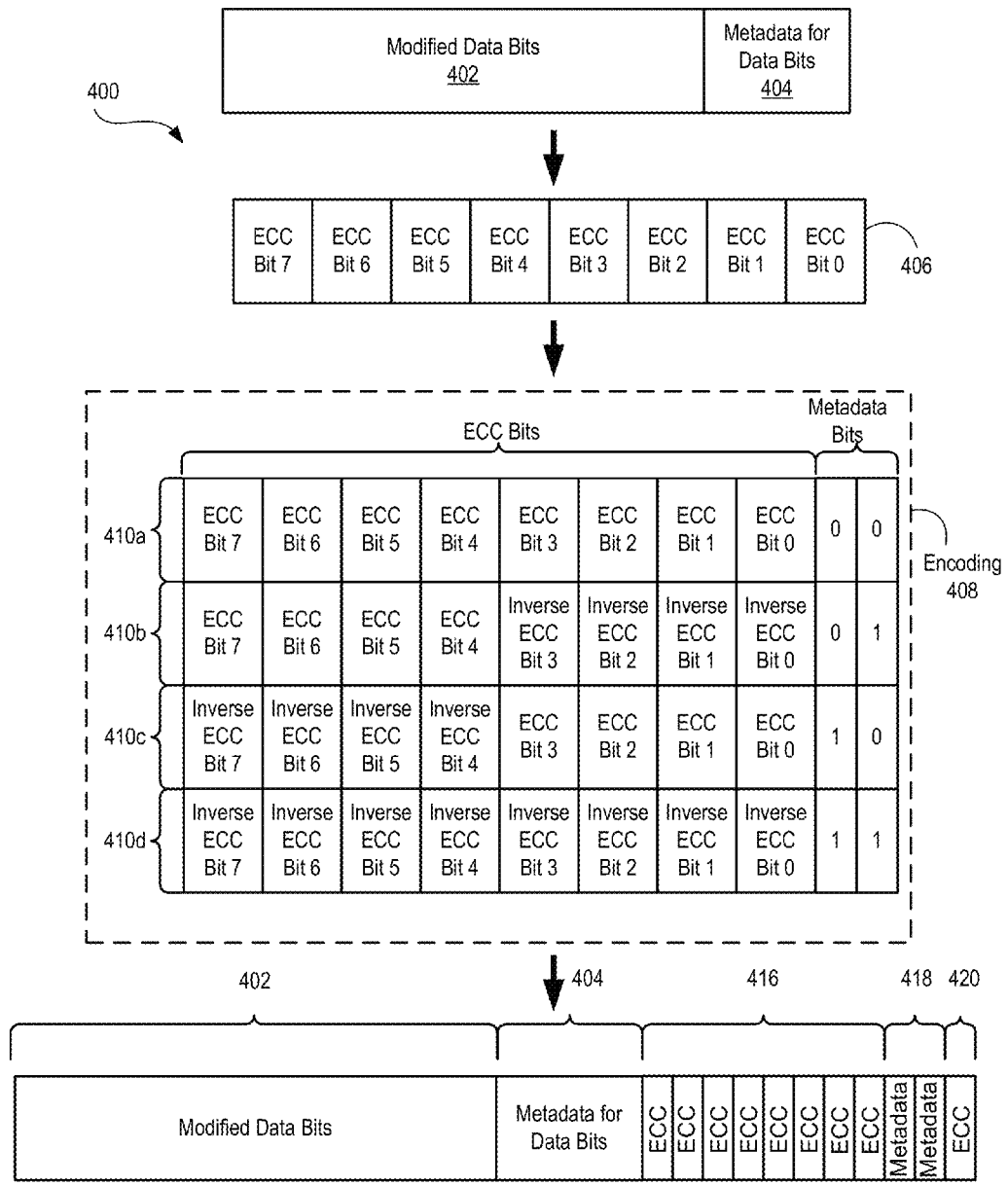
FIG. 4 is a block diagram of a metadata encoding scheme for ECC bits, according to one embodiment.

FIG. 4 is a block diagram of a metadata encoding scheme for ECC bits, according to one embodiment.

The metadata encoding scheme 400 encodes ECC bits 406. The ECC bits 406 are calculated for the modified data bits 402 and the metadata bits 404. The encoding table 408 illustrates a "flip" or inversion wear-reduction scheme, where subsections of ECC bits are inverted (or not) during storage depending on the previous value of the ECC stored at the same address, and metadata bits are (re)set to reflect whether the bits in the subsection are inverted. According to one embodiment, a flip wear-reduction scheme provides improved wear-reduction due in part to the behavior of the ECC bits 406 (e.g., because the number of ECC bits 406 is relatively small compared to the number of data bits 402 and because each ECC bit's value depends on a relatively large number of data bits, the ECC bits are likely to toggle at every iteration.).

The flip scheme illustrated in encoding table 408 utilizes two metadata bits for eight ECC bits. Each of the metadata bits is dedicated to one of the mutually exclusive subsections of the ECC bits. For each subsection, the number of ECC bits in that subsection that change their value (i.e., toggle) during a write is calculated. If the number of bits that will change is greater than half the total number of bits in the subsection, all the bits in that subsection are inverted, and the metadata bit dedicated to that subsection is set to a one. If the number of toggling bits is less than or equal to half the number of bits in that subsection, the bits are written back as they are, and the metadata bit for that subsection is set to 0. Thus, according to one embodiment, at most half of the ECC bits will change their values during the write, which can reduce wear of the non-volatile memory.

For example, encoding 410a illustrates a scenario where none of the ECC bits are flipped (with both metadata bits equal to 0). Encoding 410b illustrates a scenario where ECC bits 7-4 are not flipped (with a corresponding metadata bit equal to 0), but ECC bits 3-0 are flipped (with a corresponding metadata bit equal to 1). Encoding 410c illustrates a scenario where ECC bits 7-4 are flipped (with a corresponding metadata bit equal to 1), but ECC bits 3-0 are not flipped (with a corresponding metadata bit equal to 0). Finally, encoding 410d illustrates the scenario where all the ECC bits are flipped (with both metadata bits equal to 1). The metadata bits 418 indicating inversion can be stored along with the modified data bits 402, the metadata bits 404, and the modified ECC bits 416. An additional ECC bit 420 can be calculated to protect the metadata bits 418, and stored with the other content, as described above with reference to FIGS. 1 and 2.

During a read operation, and after ECC checks are complete, the metadata bits for each subsection are determined, and the operation that was performed during the write is repeated. For example, if the metadata bit of a subsection is 1, the ECC bits in that section are inverted again to regenerate the original value of the ECC bit. If the metadata bit of a subsection is 0, no further operation is needed to recover the original value.

Although the encoding scheme 400 illustrates two metadata bits for a flip scheme, any number of metadata bits can be used (e.g., one or a plurality of metadata bits). A larger number of metadata bits can enable finer-grain wear-reduction, but can increase overhead. Additionally, although metadata encoding scheme 400 refers to encoding for ECC bits, data bits or bits of other types can also use a flip encoding scheme.

Figure 5:
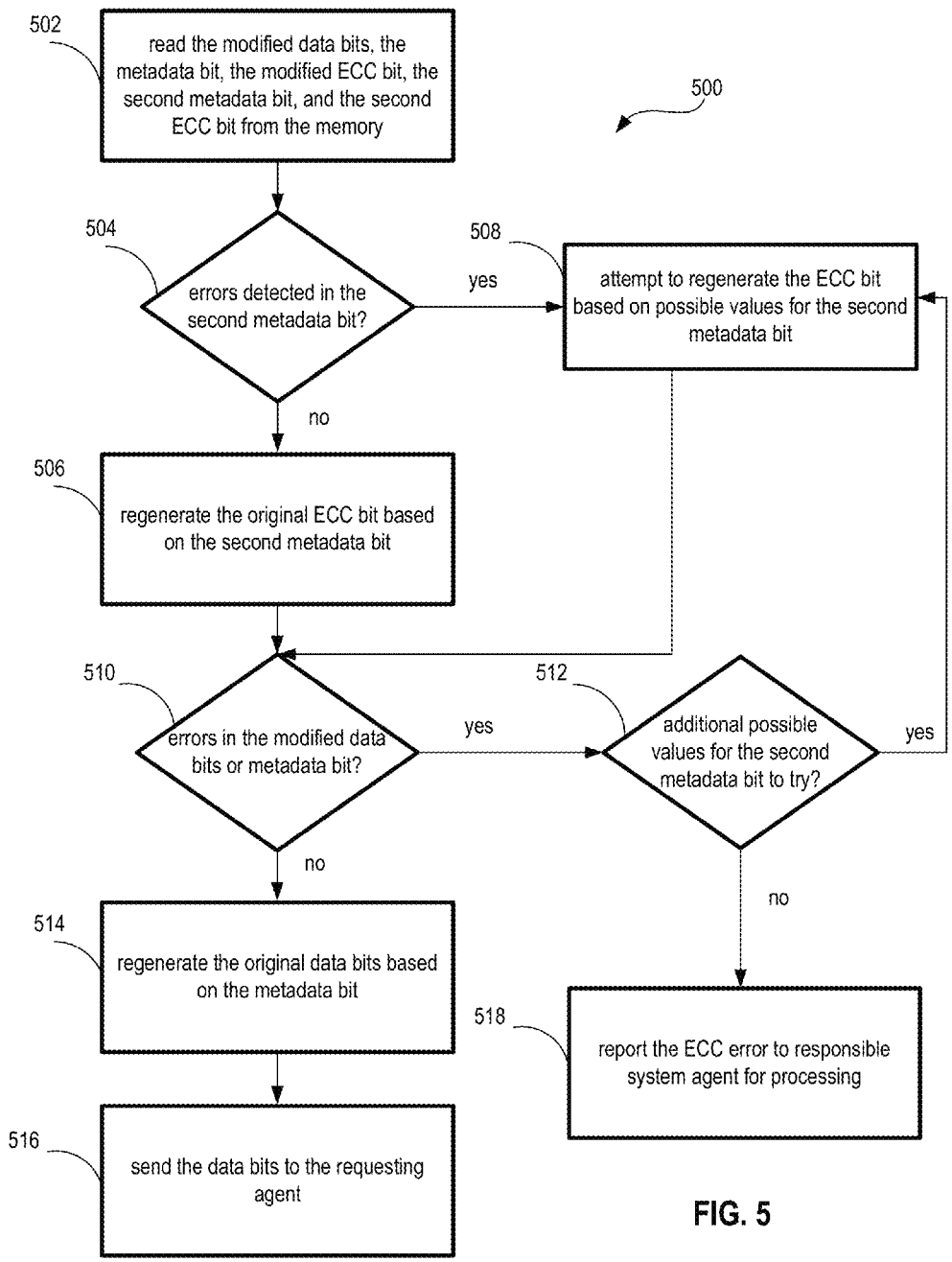
FIG. 5 is a flow diagram of a process including regenerating original data based on a metadata bit, an ECC bit, a second metadata bit, and a second ECC bit, according to one embodiment.

FIG. 5 is a flow diagram of a process including regenerating original data based on a metadata bit, an ECC bit, a second metadata bit, and a second ECC bit, according to one embodiment.

The process 500 begins when a system reads the stored modified data bits, the metadata bit, the modified ECC it, the second metadata bit, and the second ECC bit from the non-volatile memory (e.g., when the system reads content 100 of FIG. 1 from memory), 502. For example, if a rotation scheme for the data bits and a flip scheme for the ECC bit are used, the system reads the shifted data bits, the metadata bit, the inverted ECC bit, the second metadata bit, and the second ECC bit from the non-volatile memory. The contents can be read from memory in response to, for example, a read request to the memory address.

Next, the system detects whether the second metadata bit has errors, 504. In one embodiment, to determine whether the second metadata bit has errors, the system uses the second metadata bit and the second ECC bit. If there are no errors detected in the second metadata bit, the system regenerates the original ECC bit based on the second metadata bit, 506. For example, if a flip scheme for the ECC bit is used, responsive to detecting the read second metadata bit contains no errors, the system regenerates the ECC bit from the inverted ECC bit based on the second metadata bit. Once the original ECC bit is regenerated, the system uses the ECC bit to detect whether the modified data bits and metadata bit have errors, 510. For example, if an SECDED scheme is implemented, the system can perform SECDED decoding. If no errors are detected in the modified data bits or the modified metadata bit, the system regenerates the original data bits based on the metadata bit, 514. The system then sends the regenerated data bits to the requesting agent, 516.

If the system detects errors, the system attempts to regenerate the ECC bit based on possible values for the second metadata bit, 508. A system utilizing a single second ECC bit for parity can preserve the system's SECDED property. For example, in an embodiment implementing the flip scheme (e.g., the encoding scheme 400 of FIG. 4), upon detection of an error in the second metadata bit and/or the second ECC bit, the data bits will be calculated using the ECC bit and the inverse of the ECC bit for each subsection of ECC protected by second metadata bits. In one such embodiment, K second metadata bits would require $2^K$ (i.e., 2 to the power of K) iterations of re-calculating the original ECC bit with the particular combination of second metadata bits; using the ECC value calculated for an iteration, the system determines the original data bits and the metadata bit. These iterations can be performed in parallel (e.g., by replicating the decoding circuit in hardware), consecutively (e.g., using a single decoding circuit), or a mix of both (e.g., if a system has multiple resources that are less than the number of iterations required).

The system detects whether the modified data bits or metadata bit contain errors based on each iteratively regenerated value of the ECC bit, 510. If errors are detected, additional possible values of the ECC bit are tried, 512. If no additional possible values for the ECC bit remain, the system reports the ECC error to a system agent for processing, 518. Regardless of the implementation of decoding, one of the iterations can provide error-free data bits and the metadata bit if there is only one error (e.g., one error in the second metadata bit). If none of the iterations generate an error-free decoding, one of the data bits, the metadata bit, or the ECC bits, has an additional error, which the system has detected. It can be possible that more than one of the iterations provides error-free decoding if there are more errors than protected by the ECC scheme (e.g., three or more errors in an SECDED implementation).

In the case of SECDED, where the second ECC bit is a single parity bit, if the second metadata bit and the second ECC bit contain two errors, the system will not be able to observe and/or correct the error in the second metadata bit, according to one embodiment. However, since the ECC bit will not be regenerated correctly from the erroneous second metadata bit, the ECC bit (which, for example, covers the data bits, the metadata bit, and the ECC bit) will not generate an error-free output (if, for example, there are no additional errors in the bits involved in this step) and the error will be detected and forwarded to the iterative process checking alternatives to regenerate the ECC, in which case one iteration results in a successful decoding.

Thus, the protection mechanism provided by the second ECC bit (for the second metadata bit) can be weaker than the protection provided by the ECC bit (for the data bits and the metadata bit) and still meet the original protection level by using additional steps in the decoding process. For example, if the ECC bit provides SECDED-level protection, the second ECC bit can be a single parity bit, and still maintain SECDED-level protection.

Figure 6:
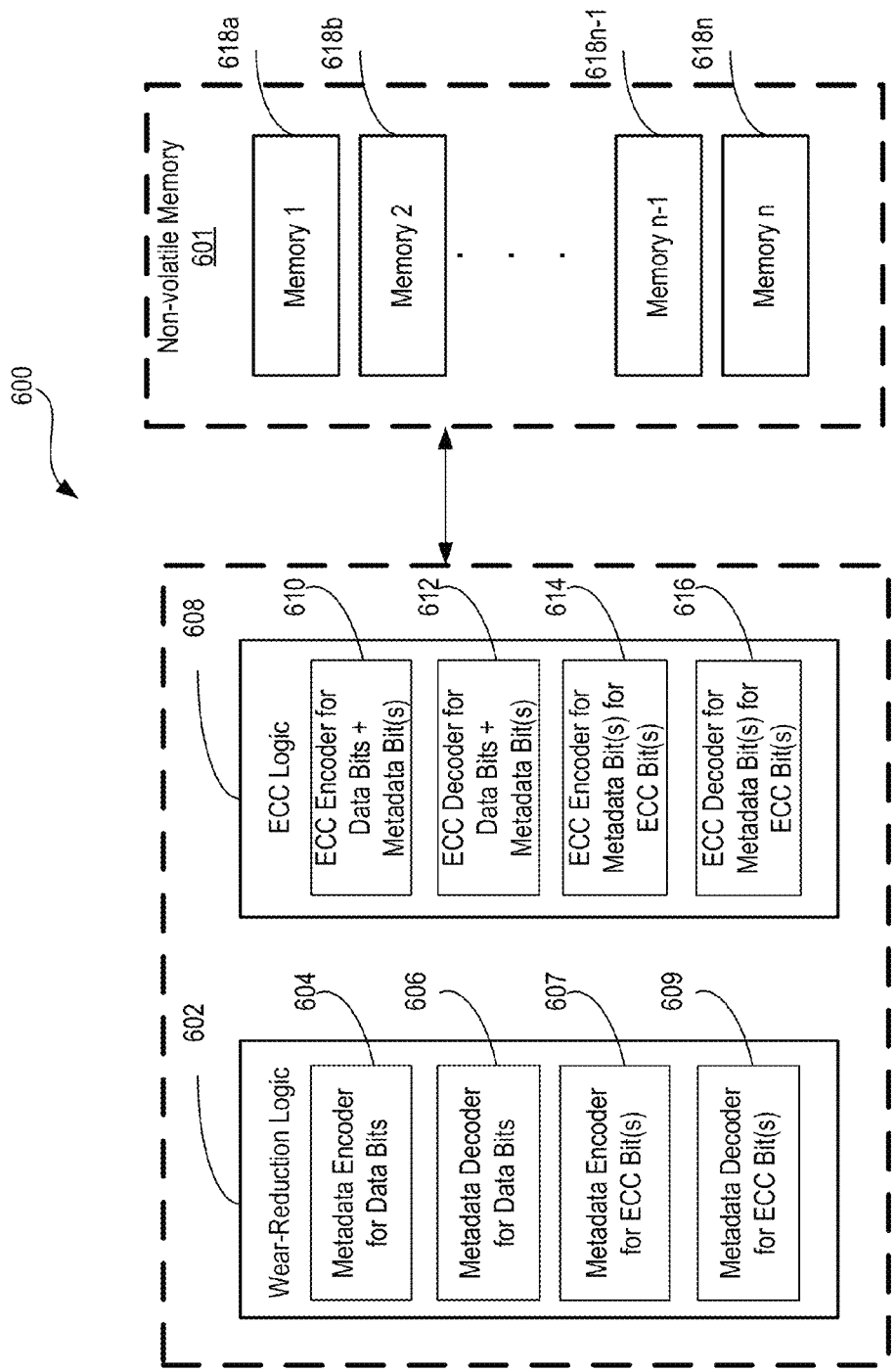
FIG. 6 is a block diagram of a memory subsystem, according to one embodiment.

FIG. 6 is a block diagram of a memory subsystem, according to one embodiment.

The memory subsystem 600 includes a non-volatile memory 601 with multiple memory chips 618a-618n with endurance limitations. In one embodiment, the non-volatile memory 601 includes a phase-change memory. In other embodiments, memory 601 includes NAND Flash, resistive-RAM, single-electron memory, magnetic RAM (MRAM), spin-transfer torque RAM (STTRAM), nanowire memory, ferroelectric RAM (FRAM), phase change memory and switch (PCMS), and/or ferroelectric transistor RAM (Fe-TRAM). The memory subsystem 600 also includes wear-reduction logic 602 and ECC logic 608. The wear-reduction logic 602 and the ECC logic 608 can perform processes such as the encoding process 200 of FIG. 2, and the decoding process 5 of FIG. 5. The wear-reduction logic 602 and the ECC logic 608 can reside within the non-volatile memory 601, or external to the non-volatile memory 601 (e.g., in a memory controller coupled with the non-volatile memory 601).

The wear-reduction logic 602 includes a logic unit 604 to apply a first wear-reduction modification to data bits to be written to a non-volatile memory, to and to generate metadata bit(s) indicating the first wear-reduction modification. For example, the wear-reduction logic 602 includes a metadata encoder 604 to shift data bits to be written to a non-volatile memory and to generate metadata bit(s) indicating the shift to the data bits. The wear-reduction logic 602 also includes a logic unit 607 to apply a second wear-reduction modification to the ECC bit(s), and to generate second metadata bit(s) indicating the second wear-reduction modification. For example, the wear-reduction logic 602 includes a metadata encoder 607 to invert the ECC bit(s) based on an existing value at a location where the ECC bit(s) are to be written, and to generate second metadata bit(s) indicating whether the ECC bit(s) are inverted.

In one embodiment, the metadata encoder 604 for data bits is to apply a first wear-reduction modification to the data bits that is different than a second wear-reduction modification applied by the metadata encoder 607 to the ECC bit(s). For example, the metadata encoder 604 is to perform a shift of groups of data bits within a word based on a write counter, and the metadata encoder 607 is to invert the ECC bit(s) based on an existing value at a location where the ECC bit is to be written. In another embodiment, both the metadata encoder 604 for the data bits and the metadata encoder 607 for the ECC bit(s) perform the same wear-reduction modification (e.g., rotation or inversion).

Wear-reduction logic also includes a logic unit 606 to regenerate the data bits from the modified data bits based on the metadata bit(s), and logic unit 609 to regenerate the ECC bit(s) from the modified ECC bit(s) based on the second metadata bit(s). For example, wear-reduction logic 602 includes a metadata decoder 606 to regenerate the data bits from the shifted data bits based on the metadata bit(s) when the ECC decoder detects that the shifted data bits and the metadata bit(s) contain no errors; wear-reduction logic 602 includes a metadata decoder 609 to regenerate the ECC bit(s) from the inverted ECC bit(s) based on the second metadata bit(s) when the ECC decoder detects that the second metadata bit(s) contain no errors. Although the metadata encoder 604, the metadata decoder 606, the metadata encoder 607, and the metadata decoder 609 are illustrated as separate logic blocks, the wear-reduction logic 602 can be combined or separated into any number of logic blocks.

The ECC logic 608 includes a logic unit 610 to calculate ECC bit(s) for the modified data bits (e.g., the shifted data bits) and the metadata bit(s) for the data bits. For example, the ECC logic 608 includes an ECC encoder 610 for the data bits and the metadata bit(s) to calculate an ECC bit for the shifted data bits and the metadata bit(s). The ECC logic 608 also includes a logic unit 614 to calculate a second ECC bit for the second metadata bit. For example, ECC logic 608 includes an ECC encoder 614 for the metadata bit(s) for the ECC bit(s), to calculate second ECC bit(s) for the second metadata bit(s).

The ECC logic 608 includes a logic unit to detect whether the second metadata bit as read from the non-volatile memory contains errors based on the second ECC bit (e.g., an ECC decoder 612 for the data bits and the metadata bit(s)), and a logic unit to detect whether the modified data bits and the metadata bit contain errors based on the ECC bit (e.g., an ECC decoder 616 for the metadata bit(s) for the ECC bit(s). Although the ECC encoder 610, the ECC decoder 612, the ECC encoder 614, and the ECC decoder 616 are illustrated as separate logic units, the ECC logic 608 can be implemented as any combination of additional or fewer logic units. Additionally, ECC decoding circuits (e.g., ECC decoder 612 and/or ECC decoder 616) can be replicated and used in parallel (e.g., for performance driven systems).

In one embodiment, the content generated and/or modified by the wear-reduction logic and the ECC logic (e.g., modified data bits, the metadata bit, the modified ECC bit, the second metadata bit, and the second ECC bit) is to be stored in the non-volatile memory 601, and later read back and decoded and/or regenerated by the wear-reduction logic and the ECC logic.

Figure 7:
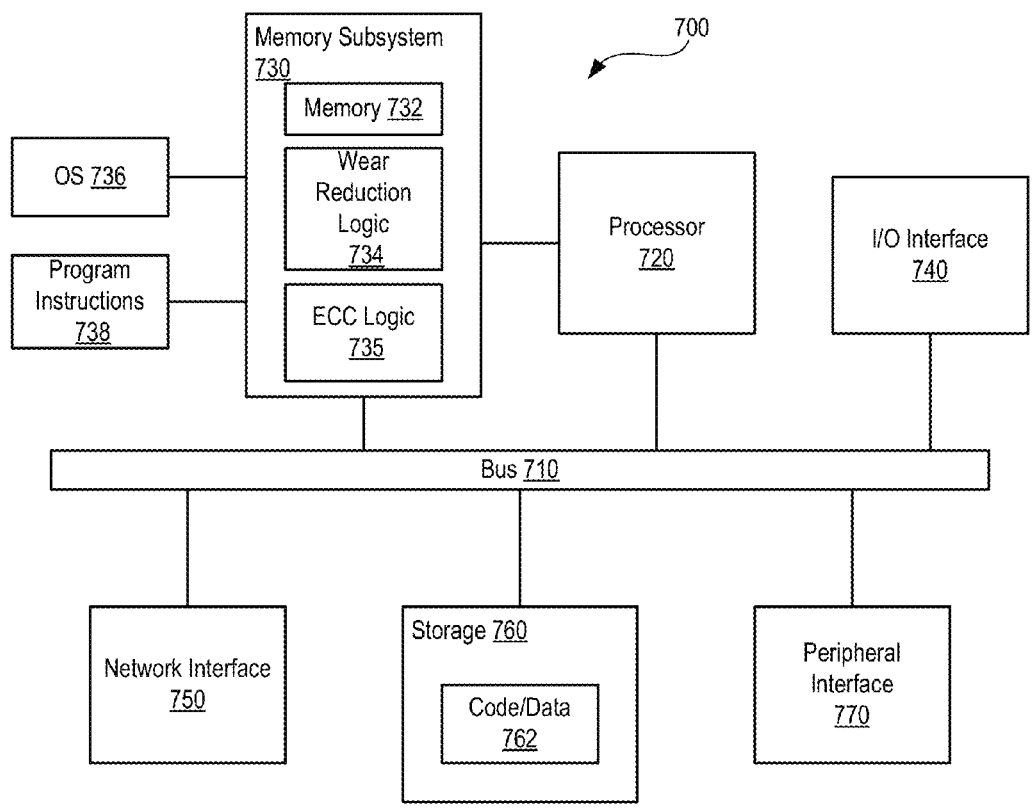
FIG. 7 is a block diagram of a computing system with endurance-aware ECC protection, according to one embodiment.

FIG. 7 is a block diagram of a computing system with endurance-aware ECC protection, according to one embodiment.

System 700 represents a computing device in accordance with any embodiment described herein, and can be a laptop computer, a desktop computer, a server, a gaming or entertainment control system, a scanner, copier, printer, or other electronic device. System 700 includes processor 720, which provides processing, operation management, and execution of instructions for system 700. Processor 720 can include any type of microprocessor, central processing unit (CPU), processing core, or other processing hardware to provide processing for system 700. Processor 720 controls the overall operation of system 700, and can include one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 730 can represent main memory, cache, or any other memory (e.g., any device providing storage for code to be executed by processor 720 or data values) for system 700. Memory subsystem 730 includes memory 732, which represents one or more memory devices that can include read-only memory (ROM), flash memory, one or more varieties of random access memory (RAM), or other memory devices, or a combination of such devices. Memory subsystem 730 includes wear-reduction logic 734 (e.g., wear-reduction logic 602 of FIG. 6) and ECC logic 735 (e.g., ECC logic 608 of FIG. 6), in accordance with any embodiment described herein. In one embodiment, memory subsystem 730 also includes a memory controller (not shown), which can control read and write operations to and from memory 732. In one embodiment, memory subsystem 730 is located on processor 720. In another embodiment, memory subsystem 730 is located on a separate device. In yet another embodiment, one or more parts of memory subsystem 730 are located on processor 720 and other parts of memory subsystem 730 are located on a separate device. In one embodiment, memory 732 could be designed as a cache and included as part of processor 720.

Memory subsystem 730 can store and host, among other things, operating system (OS) 736 to provide a software platform for execution of instructions in system 700. Additionally, other program instructions 738 are stored and executed from memory subsystem 730 to provide the logic and the processing of system 700. OS 736 and program instructions 738 are executed by processor 720.

Processor 720 and memory subsystem 730 are coupled to bus/bus system 710. Bus 710 is an abstraction that represents any one or more separate physical buses, communication lines/interfaces, and/or point-to-point connections, connected by appropriate bridges, adapters, and/or controllers. Therefore, bus 710 can include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 710 can also correspond to interfaces in network interface 750.

In one embodiment, bus 710 includes a data bus that is a data bus included in memory subsystem 730 over which processor 720 can read values from memory 732. The additional line shown linking processor 720 to memory subsystem 730 represents a command bus over which processor 720 provides commands and addresses to access memory 732.

System 700 also includes one or more input/output (I/O) interface(s) 740, network interface 750, one or more internal mass storage device(s) 760, and peripheral interface 770 coupled to bus 710. I/O interface 740 can include one or more interface components through which a user interacts with system 700 (e.g., video, audio, and/or alphanumeric interfacing). Network interface 750 provides system 700 the ability to communicate with remote devices (e.g., servers, other computing devices) over one or more networks. Network interface 750 can include an Ethernet adapter, wireless interconnection components, USB (universal serial bus), one or more antennae, or other wired or wireless standards-based or proprietary interfaces.

Storage 760 can be or include any conventional medium for storing large amounts of data in a nonvolatile manner, such as one or more magnetic, solid state, or optical based disks, or a combination. Storage 760 holds code or instructions and data 762 in a persistent state (i.e., the value is retained despite interruption of power to system 700). Storage 760 can also be generically considered to be a "memory." Whereas storage 760 is nonvolatile, memory 732 can include volatile (i.e., the value or state of the data is indeterminate if power is interrupted to system 700) and/or non-volatile memory.

Peripheral interface 770 can include any hardware interface not specifically mentioned above. Peripherals refer generally to devices that connect dependently to system 700. A dependent connection is one where system 700 provides the software and/or hardware platform on which operation executes, and with which a user interacts.

Various components described herein can be a means for performing the operations or functions described. Each component described herein includes software, hardware, or a combination of these. The components can be implemented as software modules, firmware modules, hardware modules, special-purpose hardware (e.g., application specific hardware, application specific integrated circuits (ASICs), digital signal processors (DSPs), or other special-purpose hardware), embedded controllers, hardwired circuitry, or as any combination of software, firmware, and/or hardware.

Figure 8:
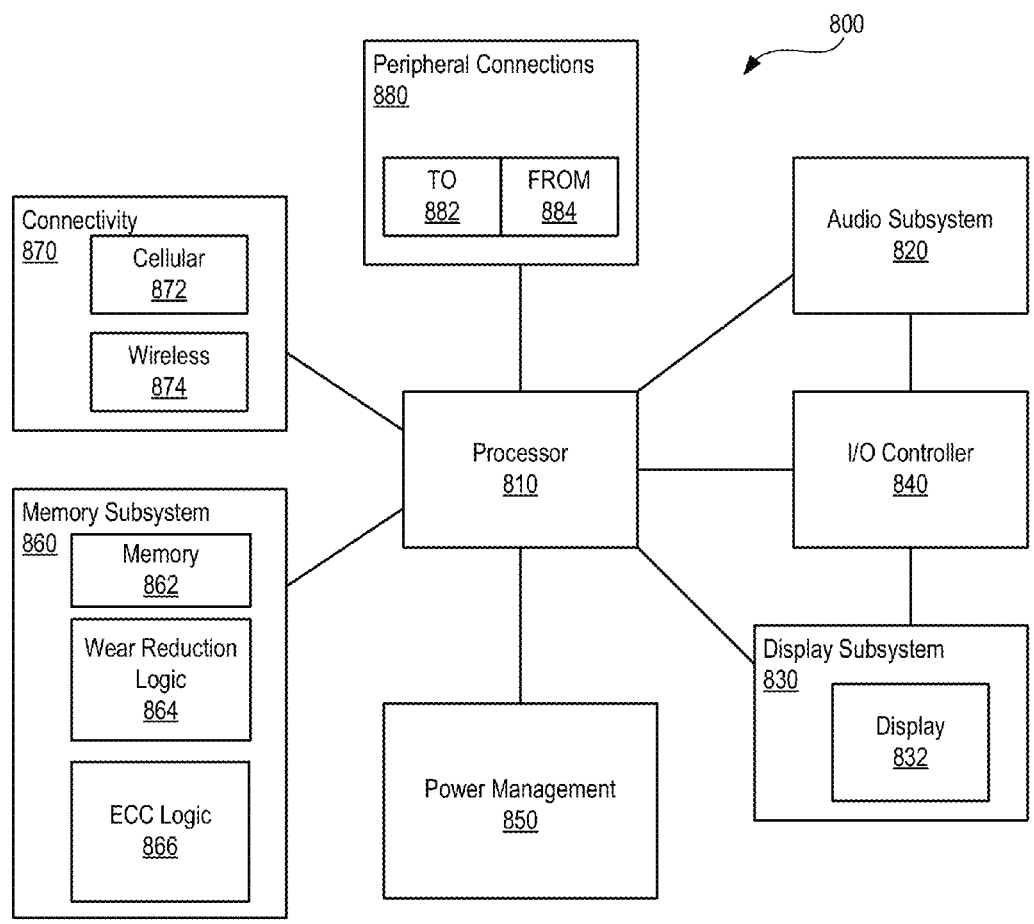
FIG. 8 is a block diagram of an embodiment of a mobile device with endurance-aware ECC protection, according to one embodiment.

FIG. 8 is a block diagram of an embodiment of a mobile device with endurance-aware ECC protection, according to one embodiment.

Device 800 represents a mobile computing device, such as a computing tablet, a mobile phone or smartphone, a wireless-enabled e-reader, or other mobile device. It will be understood that certain of the illustrated components are shown generally, and not all components of such a device are shown in device 800.

Device 800 includes processor 810, which performs the primary processing operations of device 800. Processor 810 can include one or more physical devices, such as microprocessors, application processors, microcontrollers, programmable logic devices, or other processing means. In one embodiment, processor 810 includes optical interface components in addition to a processor die. Thus, the processor die and photonic components are in the same package. Such a processor package can interface optically with an optical connector in accordance with any embodiment described herein.

The processing operations performed by processor 810 include the execution of an operating platform or operating system on which applications and/or device functions are executed. The processing operations include operations related to I/O (input/output) with a human user or with other devices, operations related to power management, and/or operations related to connecting device 800 to another device. The processing operations can also include operations related to audio I/O and/or display I/O.

In one embodiment, device 800 includes audio subsystem 820, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 800, or connected to device 800. In one embodiment, a user interacts with device 800 by providing audio commands that are received and processed by processor 810.

Display subsystem 830 represents hardware (e.g., display devices) and software (e.g., drivers) components that provide a visual and/or tactile display for a user to interact with the computing device. Display subsystem 830 includes display 832, which includes the particular screen or hardware device used to provide a display to a user. In one embodiment, display 832 includes logic separate from processor 810 to perform at least some processing related to the display. In one embodiment, display subsystem 830 includes a touchscreen device that provides both output to and input from a user.

I/O controller 840 represents hardware devices and software components related to interaction with a user. I/O controller 840 can operate to manage hardware that is part of audio subsystem 820 and/or display subsystem 830. Additionally, I/O controller 840 illustrates a connection point for additional devices that connect to device 800 through which a user might interact with the system. For example, devices that can be attached to device 800 might include microphone devices, speaker or stereo systems, video systems or other display device, keyboard or keypad devices, or other I/O devices for use with specific applications such as card readers or other devices.

As mentioned above, I/O controller 840 can interact with audio subsystem 820 and/or display subsystem 830. For example, input through a microphone or other audio device can provide input or commands for one or more applications or functions of device 800. Additionally, audio output can be provided instead of or in addition to display output. In another example, if display subsystem 832 includes a touchscreen, the display device also acts as an input device, which can be at least partially managed by I/O controller 840. There can also be additional buttons or switches on device 800 to provide I/O functions managed by I/O controller 840.

In one embodiment, I/O controller 840 manages devices such as accelerometers, cameras, light sensors or other environmental sensors, gyroscopes, global positioning system (GPS), or other hardware that can be included in device 800. The input can be part of direct user interaction, as well as providing environmental input to the system to influence its operations (such as filtering for noise, adjusting displays for brightness detection, applying a flash for a camera, or other features).

Memory subsystem 860 includes memory 862 for storing information in device 800. Memory 862 can include non-volatile (state does not change if power to the memory device is interrupted) and/or volatile (state is indeterminate if power to the memory device is interrupted) memory devices. In one embodiment, non-volatile memory with ECC and metadata serves as a replacement for volatile main memory for device 800. Memory 862 can store application data, user data, music, photos, documents, or other data, as well as system data (whether long-term or temporary) related to the execution of the applications and functions of system 800. Memory subsystem 860 includes wear-reduction logic 864 and ECC logic 866, in accordance with any embodiment described herein. In one embodiment, memory subsystem 860 further includes a memory controller, which can control read and write operations to and from memory 862, in accordance with any embodiment described herein. In one embodiment, memory subsystem 860 is located on processor 810. In another embodiment, memory subsystem 860 is located on a separate device. In yet another embodiment, one or more parts of memory subsystem 860 are located on processor 810 and other parts of memory subsystem 860 are located on a separate device. In one embodiment, memory 862 is designed as caches and included as part of processor 810.

In one embodiment, device 800 includes power management 850 that manages battery power usage, charging of the battery, and features related to power saving operation. Power management 850 can initiate a transition between two or more power states for system 800, or for select sub-parts of system 800.

Connectivity 870 includes hardware devices (e.g., wireless and/or wired connectors, one or more antennae, and/or communication hardware) and software components (e.g., drivers, protocol stacks) to enable device 800 to communicate with external devices. The device could be separate devices, such as other computing devices, wireless access points or base stations, as well as peripherals such as headsets, printers, or other devices.

Connectivity 870 can include multiple different types of connectivity. To generalize, device 800 is illustrated with cellular connectivity 872 and wireless connectivity 874. Cellular connectivity 872 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 874 refers to wireless connectivity that is not cellular, and can include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 880 include hardware interfaces and connectors, as well as software components (e.g., drivers, protocol stacks) to make peripheral connections. It will be understood that device 800 could both be a peripheral device ("to" 882) to other computing devices, as well as have peripheral devices ("from" 884) connected to it. Device 800 commonly has a "docking" connector to connect to other computing devices for purposes such as managing (e.g., downloading and/or uploading, changing, synchronizing) content on device 800. Additionally, a docking connector can allow device 800 to connect to certain peripherals that allow device 800 to control content output, for example, to audiovisual or other systems.

In addition to a proprietary docking connector or other proprietary connection hardware, device 800 can make peripheral connections 880 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, a method includes: calculating an error-correcting code (ECC) bit for shifted data bits and a metadata bit, the metadata bit indicating a shift to data bits to be written to a non-volatile memory. The method includes calculating a second ECC bit for a second metadata bit, the second metadata bit indicating an inversion of the ECC bit. The method includes storing, in the non-volatile memory, the shifted data bits, the metadata bit, the inverted ECC bit, the second metadata bit, and the second ECC bit.

In one embodiment, an apparatus includes a first logic unit to shift data bits to be written to a non-volatile memory and to generate a metadata bit indicating a shift to the data bit. The apparatus includes a second logic unit to calculate an error-correcting code (ECC) bit for the shifted data bits and the metadata bit. The first logic unit is further to invert the ECC bit based on an existing value at a location where the ECC bit is to be written and to generate a second metadata bit indicating whether the ECC bit is inverted. The second logic unit is further to calculate a second ECC bit for the second metadata bit. The shifted data bits, the metadata bit, the inverted ECC bit, the second metadata bit, and the second ECC bit are to be stored in the non-volatile memory.

In one embodiment, the shift to the data bits includes a cyclic shift of groups of data bits within a word based on a write counter, the write counter indicating a number of writes to a page to which the data bits are to be written.

In one embodiment, the shift to the data bits includes a cyclic shift of groups of data bits within a word based on a write counter, the write counter indicating a number of writes to a word to which the data bits are to be written.

In one embodiment, the shift to the data bits includes a cyclic shift of groups of data bits within a word based on a write counter, the write counter indicating a number of writes to the non-volatile memory.

In one embodiment, the shift to the data bits includes a cyclic shift of groups of data bits within a page based on a write counter, the write counter indicating a number of writes to the page.

In one embodiment, the inversion of the ECC bit comprises an inversion based on an existing value at a location where the ECC bit is to be written.

In one embodiment, the apparatus further includes a third logic unit to detect whether the second metadata bit as read from the non-volatile memory contains errors based on the second ECC bit. The apparatus further includes a fourth logic unit to regenerate the ECC bit from the inverted ECC bit based on the second metadata bit when the third logic unit detects that the second metadata bit contains no errors. The third logic unit is to detect whether the shifted data bits and the metadata bit contain errors based on the ECC bit. The fourth logic unit is to regenerate the data bits from the shifted data bits based on the metadata bit when the third logic unit detects that the shifted data bits and the metadata bit contain no errors.

In one embodiment, the third logic unit, responsive to detecting the second metadata bit contains errors, is to iteratively regenerate the ECC bit from the inverted ECC bit based on possible values for the second metadata bit. The third logic unit is to further detect whether the shifted data bits and the metadata bit contain errors based on each of the iteratively regenerated ECC bits. The fourth logic unit is to further regenerate the data bits from the shifted data bits based on the metadata bit when the third logic unit detects that the shifted data bits and the metadata bit contain no errors based on one of the iteratively regenerated ECC bits.

In one embodiment, the third logic unit, responsive to detecting the shifted data bits and the metadata bit contain errors based on each of the iteratively regenerated ECC bits, is to report an ECC error.

In one embodiment, the first logic unit is to generate a plurality of metadata bits indicating the shift to the data bits, and the second logic unit is to further calculate a plurality of ECC bits for the shifted data bits and the metadata bit.

In one embodiment, the first logic unit is to generate a plurality of second metadata bits indicating the inversion to the plurality of ECC bits, and the second logic unit is to further calculate a plurality of second ECC bits for the plurality of second metadata bits.

In one embodiment, the apparatus is comprised in a memory controller. In one embodiment, the apparatus is comprised in a memory.

In one embodiment, an apparatus includes a first logic unit to apply a first wear-reduction modification to data bits to be written to a non-volatile memory, and to generate a metadata bit indicating the first wear-reduction modification. The apparatus includes a second logic unit to calculate an ECC bit for the modified data bits and the metadata bit. The first logic unit is further to apply a second wear-reduction modification to the ECC bit, and to generate a second metadata bit indicating the second wear-reduction modification. The second logic unit is further to calculate a second ECC bit for the second metadata bit. The modified data bits, the metadata bit, the modified ECC bit, the second metadata bit, and the second ECC bit are to be stored for later recovery of the data bits.

In one embodiment, the first wear-reduction modification to the data bits is different than the second wear-reduction modification to the ECC bit.

In one embodiment, the first logic unit to apply the first wear-reduction modification is to perform a shift of groups of data bits within a word based on a write counter, the write counter indicating a number of writes to one of: the non-volatile memory, a page to which the data bits are to be written, and a word to which the data bits are to be written.

In one embodiment, the first logic unit to apply the second wear-reduction modification is to invert the ECC bit based on an existing value at a location where the ECC bit is to be written.

In one embodiment, the apparatus includes a third logic unit to detect whether the second metadata bit as read from the non-volatile memory contains errors based on the second ECC bit. The apparatus further includes a fourth logic unit to regenerate the ECC bit from the modified ECC bit based on the second metadata bit. The third logic is to further detect whether the modified data bits and the metadata bit contain errors based on the ECC bit. The fourth logic unit is to regenerate the data bits from the modified data bits based on the metadata bit.

In one embodiment, a system includes a non-volatile memory coupled with a processor, an antenna, a first logic unit to shift data bits to be written to the non-volatile memory and to generate a metadata bit indicating a shift to the data bits, and a second logic unit to calculate an ECC bit for the shifted data bits and the metadata bit. The first logic unit is further to invert the ECC bit based on an existing value at a location where the ECC bit is to be written and to generate a second metadata bit whether the ECC bit is inverted. The second logic unit is further to calculate a second ECC bit for the second metadata bit. The shifted data bits, the metadata bit, the inverted ECC bit, the second metadata bit, and the second ECC bit are to be stored in the non-volatile memory. In one embodiment, the system includes a display.

Thus, in accordance embodiments described herein, endurance-aware ECC protection reduces wear due to accesses to non-volatile memories while addressing the complications these mechanisms introduce to error detection and correction system.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

We claim:

1. A method comprising:
calculating an error-correcting code (ECC) bit for shifted data bits and a metadata bit, the metadata bit indicating a shift to the data bits to be written to a non-volatile memory;
calculating a second ECC bit for a second metadata bit, the second metadata bit indicating an inversion of the ECC bit; and
storing, in the non-volatile memory, the shifted data bits, the metadata bit, the inverted ECC bit, the second metadata bit, and the second ECC bit.

2. The method of claim 1, wherein the shift to the data bits comprises a cyclic shift of groups of data bits within a word based on a write counter, the write counter indicating a number of writes to a page to which the data bits are to be written.

3. The method of claim 1, wherein the shift to the data bits comprises a cyclic shift of groups of data bits within a word based on a write counter, the write counter indicating a number of writes to a word to which the data bits are to be written.

4. The method of claim 1, wherein the shift to the data bits comprises a cyclic shift of groups of data bits within a word based on a write counter, the write counter indicating a number of writes to the non-volatile memory.

5. The method of claim 1, wherein the shift to the data bits comprises a cyclic shift of groups of data bits within a page based on a write counter, the write counter indicating a number of writes to the page.

6. The method of claim 1, wherein the inversion of the ECC bit comprises an inversion based on an existing value at a location where the ECC bit is to be written.

7. The method of claim 1, wherein the metadata bit further comprises a plurality of metadata bits, and the ECC bit further comprises a plurality of ECC bits.

8. The method of claim 1, wherein the second metadata bit further comprises a plurality of second metadata bits, and the second ECC bit further comprises a plurality of second ECC bits.

9. An apparatus comprising:
a first logic unit to shift data bits to be written to a non-volatile memory and to generate a metadata bit indicating a shift to the data bits; and
a second logic unit to calculate an error-correcting code (ECC) bit for the shifted data bits and the metadata bit;
wherein the first logic unit is further to invert the ECC bit and to generate a second metadata bit indicating whether the ECC bit is inverted;
wherein the second logic unit is further to calculate a second ECC bit for the second metadata bit; and
wherein the shifted data bits, the metadata bit, the inverted ECC bit, the second metadata bit, and the second ECC bit are to be stored in the non-volatile memory.

10. The apparatus of claim 9, wherein the shift to the data bits comprises a cyclic shift of groups of data bits within a word based on a write counter, the write counter indicating a number of writes to a page to which the data bits are to be written.

11. The apparatus of claim 9, wherein the shift to the data bits comprises a cyclic shift of groups of data bits within a word based on a write counter, the write counter indicating a number of writes to a word to which the data bits are to be written.

12. The apparatus of claim 9, wherein the shift to the data bits comprises a cyclic shift of groups of data bits within a word based on a write counter, the write counter indicating a number of writes to the non-volatile memory.

13. The apparatus of claim 9, wherein the shift to the data bits comprises a cyclic shift of groups of data bits within a page based on a write counter, the write counter indicating a number of writes to the page.

14. The apparatus of claim 9, wherein the first logic unit is further to invert the ECC bit based on an existing value at a location where the ECC bit is to be written.

15. The apparatus of claim 9, wherein the first logic unit is to further generate a plurality of metadata bits indicating the shift to the data bits, and the second logic unit is to further calculate a plurality of ECC bits for the shifted data bits and the metadata bit.

16. The apparatus of claim 15, wherein the first logic unit is to further generate a plurality of second metadata bits indicating the inversion to the plurality of ECC bits, and the second logic unit is to further calculate a plurality of second ECC bits for the plurality of second metadata bits.

17. The apparatus of claim 9, wherein the apparatus is comprised in a memory controller.

18. The apparatus of claim 9, wherein the apparatus is comprised in the non-volatile memory.

19. An apparatus comprising:
a first logic unit to apply a first wear-reduction modification to data bits to be written to a non-volatile memory, and to generate a metadata bit indicating the first wear-reduction modification; and
a second logic unit to calculate an error-correcting code (ECC) bit for the modified data bits and the metadata bit;
wherein the first logic unit is further to apply a second wear-reduction modification to the ECC bit, and to generate a second metadata bit indicating the second wear-reduction modification;
wherein the second logic unit is further to calculate a second ECC bit for the second metadata bit; and
wherein the modified data bits, the metadata bit, the modified ECC bit, the second metadata bit, and the second ECC bit are to be stored for later recovery of the data bits.

20. The apparatus of claim 19, wherein the first wear-reduction modification to the data bits is different than the second wear-reduction modification to the ECC bit.

21. The apparatus of claim 19, wherein:
the first logic unit to apply the first wear-reduction modification is to perform a shift of groups of data bits within a word based on a write counter, the write counter indicating a number of writes to one of: the non-volatile memory, a page to which the data bits are to be written, and a word to which the data bits are to be written.

22. The apparatus of claim 19, wherein:
the first logic unit to apply the second wear-reduction modification is to invert the ECC bit based on an existing value at a location where the ECC bit is to be written.

23. A system comprising:
a non-volatile memory coupled with a processor;
an antenna;
a first logic unit to shift data bits to be written to the non-volatile memory and to generate a metadata bit indicating a shift to the data bits; and
a second logic unit to calculate an ECC bit for the shifted data bits and the metadata bit;
wherein the first logic unit is further to invert the ECC bit based on an existing value at a location where the ECC bit is to be written and to generate a second metadata bit whether the ECC bit is inverted;
wherein the second logic unit is further to calculate a second ECC bit for the second metadata bit; and wherein the shifted data bits, the metadata bit, the inverted ECC bit, the second metadata bit, and the second ECC bit are to be stored in the non-volatile memory.

24. The system of claim 23, further comprising:
a display.

* * * * *